(12) United States Patent
Lee et al.

(10) Patent No.: US 7,342,832 B2
(45) Date of Patent: Mar. 11, 2008

(54) BIT LINE PRE-SETTLEMENT CIRCUIT AND METHOD FOR FLASH MEMORY SENSING SCHEME

(75) Inventors: Poongyeub Lee, Cupertino, CA (US); MingChi Mitch Liu, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 111 days.

(21) Appl. No.: 11/281,253

(22) Filed: Nov. 16, 2005

(65) Prior Publication Data

US 2007/0109157 A1 May 17, 2007

(51) Int. Cl.
G11C 16/02 (2006.01)
G11C 16/28 (2006.01)
G11C 16/24 (2006.01)
G11C 7/12 (2006.01)
G11C 7/14 (2006.01)

(52) U.S. Cl. .............................. 365/185.25; 365/185.2; 365/185.21; 365/203; 365/210; 365/207

(58) Field of Classification Search ........... 365/185.21, 365/185.25, 203, 204, 207, 210, 185.2
See application file for complete search history.

(56) References Cited

U.S. PATENT DOCUMENTS

| | | | |
|---|---|---|---|
| 4,816,706 A | 3/1989 | Dhong et al. ................ 307/530 |
| 5,007,023 A | 4/1991 | Kim et al. .................... 365/203 |
| 5,305,273 A * | 4/1994 | Jinbo ..................... 365/185.21 |
| 5,339,274 A | 8/1994 | Dhong et al. ................ 365/203 |
| 5,361,229 A | 11/1994 | Chiang et al. .......... 365/189.05 |
| 5,396,467 A * | 3/1995 | Liu et al. ..................... 365/210 |
| 5,434,822 A | 7/1995 | Deleganes et al. ........... 365/203 |
| 5,528,543 A * | 6/1996 | Stiegler ....................... 365/207 |
| 5,530,671 A * | 6/1996 | Hashimoto ............. 365/185.21 |
| 5,559,737 A * | 9/1996 | Tanaka et al. ......... 365/185.25 |
| 5,563,831 A | 10/1996 | Ting ....................... 365/189.09 |
| 5,594,691 A * | 1/1997 | Bashir .................... 365/185.03 |
| 5,781,469 A | 7/1998 | Pathak et al. ................ 365/156 |
| 5,848,015 A | 12/1998 | Seno ........................... 365/203 |
| 5,864,503 A * | 1/1999 | Pascucci ................. 365/185.22 |
| 5,875,139 A | 2/1999 | Semi ........................... 365/203 |
| 5,883,845 A | 3/1999 | Khang ........................ 365/203 |
| 5,963,494 A | 10/1999 | Khang ........................ 365/203 |
| 6,021,072 A | 2/2000 | Takeda et al. ......... 365/189.11 |
| 6,023,435 A | 2/2000 | Narayana et al. ........... 365/203 |
| 6,098,145 A | 8/2000 | Huang ............................ 711/1 |
| 6,240,020 B1 | 5/2001 | Yang et al. ............. 365/185.25 |
| 6,426,914 B1 | 7/2002 | Dennard et al. ....... 365/230.06 |
| 6,490,212 B1 | 12/2002 | Nguyen et al. ............. 365/207 |

(Continued)

Primary Examiner—J. H. Hur
(74) Attorney, Agent, or Firm—Sierra Patent Group, Ltd.

(57) ABSTRACT

A flash memory array includes a reference bit line on which a reference current is imposed. During read operation, bit lines selected for reading are connected to current-to-voltage converters, each of which generates an output voltage based upon the input current flowing in the bit line. The output voltage of the current-to-voltage converter is compared to a reference voltage derived from the output of a reference current-to-voltage converter whose input is driven by a reference current on a reference bit line. Any cell that conducts more current than the reference current will be regarded as an erased cell. Conversely, any cell that conducts less current than the reference current will be regarded as a programmed cell.

4 Claims, 1 Drawing Sheet

U.S. PATENT DOCUMENTS

Figure 1:
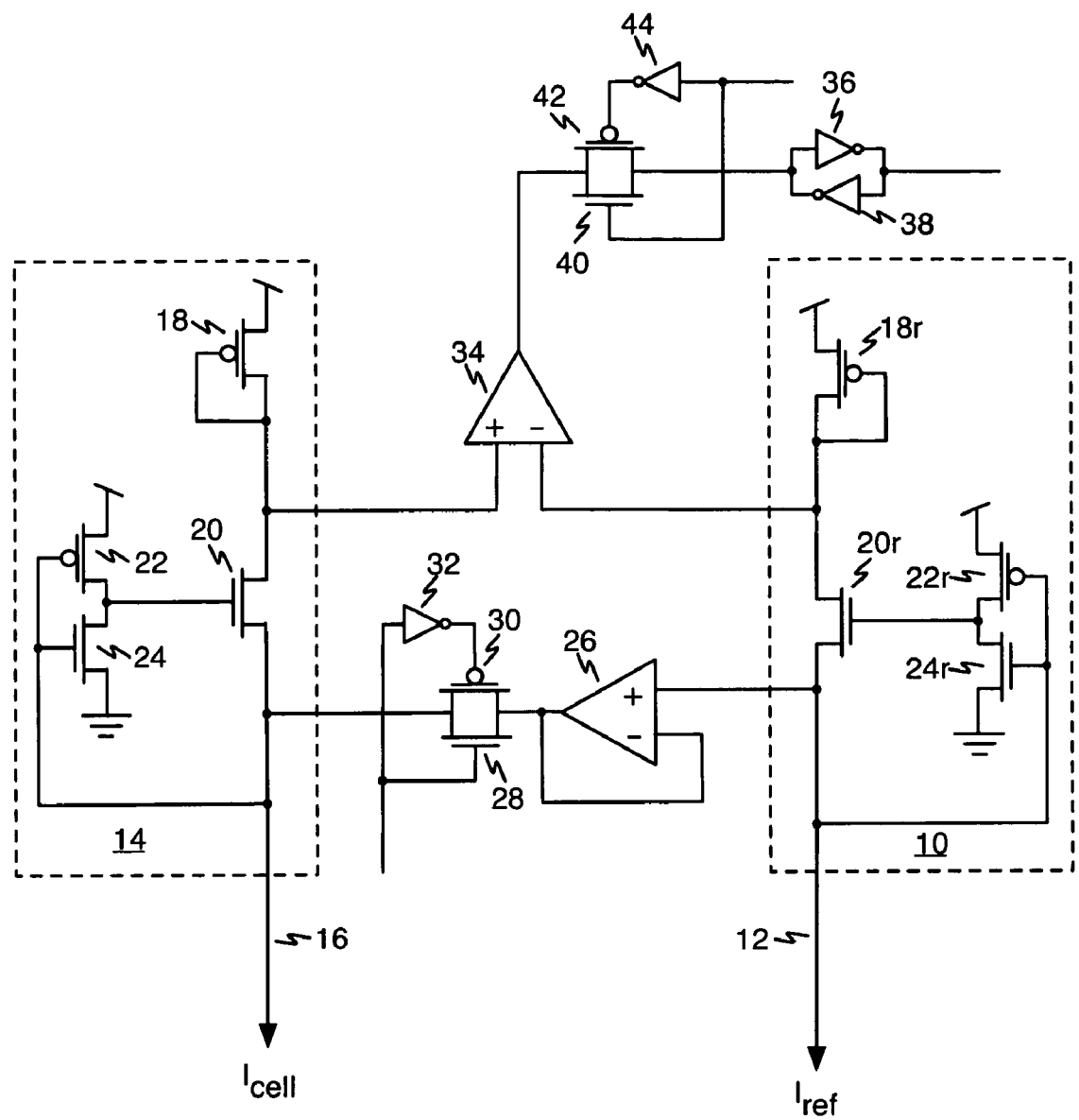

| | | | |
|---|---|---|---|
| 6,504,775 B1 | 1/2003 | Ma et al. | 365/203 |
| 6,567,327 B2 * | 5/2003 | Tsuchi | 365/203 |
| 6,608,788 B2 | 8/2003 | Ma et al. | 365/203 |
| 6,643,804 B1 | 11/2003 | Aipperspach et al. | 714/718 |
| 6,667,921 B2 | 12/2003 | Park | 365/203 |
| 6,717,856 B2 * | 4/2004 | Srinivasan et al. | 365/185.21 |
| 6,856,563 B2 | 2/2005 | Kim et al. | 365/203 |
| 2003/0016580 A1 | 1/2003 | Ma et al. | 365/203 |
| 2003/0072205 A1 | 4/2003 | Ma et al. | 365/203 |
| 2003/0123311 A1 | 7/2003 | Park | 365/203 |
| 2004/0076070 A1 | 4/2004 | Kim et al. | 365/232 |
| 2004/0151044 A1 | 8/2004 | Kant et al. | 365/203 |
| 2005/0105354 A1 | 5/2005 | Madan | 365/206 |

* cited by examiner

BIT LINE PRE-SETTLEMENT CIRCUIT AND METHOD FOR FLASH MEMORY SENSING SCHEME

BACKGROUND OF THE INVENTION

1. Field of the Invention

The present invention relates to flash memory arrays. More particularly, the present invention relates to methods and apparatus for reducing the pre-settlement time needed before a flash cell output can be sensed on a bit line in a memory array.

2. The Prior Art

Most of the prior precharging schemes known in the prior art are designed for CAM, DRAM, SRAM and ROM memory cells. These types of memories mentioned above never use a reference bit line like non-volatile memory. The sensing scheme of the above memories amplifies the difference between of one pair of differential bit lines coupled to each selected cell.

The majority of bit line precharge methods that have been adopted in the industry involve creation of a short pulse and charge up the bit line to $V_{CC}-V_t$, or to $V_{CC}$. Some known schemes pre-charge the target bit line to Vcc–|Vt|, or Vcc– 2|Vt|. U.S. Pat. No. 6,240,020 shows a NAND type Flash memory scheme in which the bit line is precharged to $V_{CC}-V_{tn}$. U.S. Pat. No. 5,105,354 discloses a scheme in which an extra "plateline" is used on the source side of the EEPROM memory cell. The plateline is coupled up by a substrate capacitance during precharge. When the wordline goes high, the voltage level on the source and drain sides of the memory cells are being equalized.

BRIEF DESCRIPTION OF THE INVENTION

A flash memory array according to the present invention includes a reference bit line on which a reference current is imposed. During a read operation, bit lines selected for reading are connected to current-to-voltage converters, each of which generates an output voltage based upon the input current flowing in the bit line. The output voltage of the current-to-voltage converter is compared to a reference voltage derived from the output of a reference current-to-voltage converter whose input is driven by a reference current on a reference bit line. Any cell that conducts more current than the reference current will be regarded as an erased cell. Conversely, any cell that conducts less current than the reference current will be regarded as a programmed cell.

BRIEF DESCRIPTION OF THE DRAWING FIGURES

FIG. 1 is a schematic diagram of a bit line pre-settlement circuit for a flash memory sensing scheme according to the present invention.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons Although the term "flash" often refers to memories that are bulk erased on a page-by-page, sector-by-sector, or entire array basis, the term is generally used in the art to refer to any electrically erasable (and re-programmable) non-volatile memory technology, regardless of the particular erase scheme. The most common flash memory devices are comprised of floating-gate transistors, though other flash technologies such as SONOS, nano-crystal, and other non-volatile transistors are also known.

To meet the read speed requirements in fast flash devices, it is desirable to reduce the read access time. The solution posed by the present invention is to equalize the voltage level of a target bit line with that of a reference bit line and therefore reduce the worst-case read access time by about 5 ns.

During a read operation, bit lines selected for reading are connected to current-to-voltage converters, each of which generates an output voltage based upon the input current flowing in the bit line. The output voltage of the current-to-voltage converter is compared to a reference voltage derived from the output of a reference current-to-voltage converter whose input is driven by a reference current on a reference bit line. Any cell that conducts more current than the reference current will be regarded as an erased cell. Conversely, any cell that conducts less current than the reference current will be regarded as a programmed cell.

Referring to FIG. 1, one current-to-voltage converter 10 is connected to a reference cell via reference bit line 12 and a cell current-to-voltage converter 14 is connected to a cell being sensed via bit line 16. In FIG. 1, the cell being sensed is represented by the current $I_{cell}$. The reference voltage-to-current converter includes diode connected p-channel MOS transistor 18r in series with n-channel MOS transistor 20r coupled to the reference bit line 12. An inverter is formed from p-channel MOS transistor 22r in series with n-channel MOS transistor 24r having an input coupled to the reference bit line 12 and an output coupled to the gate of the n-channel MOS transistor 20r. The output voltage appears at the common drain connection of MOS transistors 18r and 20r.

Like the reference voltage-to-current converter, a current-to-voltage converter associated with each bit line in the memory array includes diode connected p-channel MOS transistor 18 in series with n-channel MOS transistor 20 coupled to the bit line 16. An inverter is formed from p-channel MOS transistor 22 in series with n-channel MOS transistor 24 having an input coupled to the reference bit line 16 and an output coupled to the gate of the n-channel MOS transistor 20.

The reference cell bit line is also connected to a unity gain buffer 26. Unity-gain buffer 26 drives the reference bit line voltage to all the current-to-voltage converters next to the sense amplifiers to precharge them to a reference voltage. A full pass gate formed from n-channel MOS transistor 28, p-channel MOS transistor 30, and inverter 32 controlled by a control signal isolates each sensing bit line from the output of the driver during a non-equalization phase. A reference current flows through reference bit line 12. The reference current is selected to be approximately midway between the erased cell current and the programmed cell current. As an example, in a memory array where the erased-cell current is 15 µA and the programmed-cell current is 0, the reference current in reference bit line 12 is elected to be 7.5 µA.

The control signal is asserted for a brief pre-charge period (e.g., 10 ns at the beginning of accessing a new address. During this time, the sensing bit line 16 is forced to the voltage level close to the voltage level of the reference bit line 12 by unity-gain buffer 26. This is equivalent to sensing a mid-level (e.g., 7.5 uA) cell current regardless of the $V_t$ of the array cell and voltage level of the selected word lines.

After the control signal has been deasserted, the current sensed in the cell bit lines 16 causes a sense voltage to be generated in cell current-to-voltage converter 14. If the cell current sensed is more than the reference current, the voltage will be greater than the pre-settlement voltage placed on the bit line during the precharge period. Conversely, if the cell current sensed is less than the reference current, the voltage will be less than the pre-settlement voltage placed on the bit line during the precharge period.

After the precharge period has ended, a voltage at the drain of diode-connected p-channel MOS transistor 18 related to the current drawn by the selected flash cell is compared with a voltage at the drain of diode-connected p-channel MOS transistor 18r related to the current drawn by the reference bit line 12, in comparator 34. The output of comparator 34 represents the data bit stored in the selected flash memory cell and is latched into a data latch comprising inverters 36 and 38. The data is strobed through a full pass gate formed from n-channel MOS transistor 40, p-channel MOS transistor 42, and inverter 44 controlled by a data strobe signal.

Without the scheme implemented by the present invention, in the worst case, in order to sense bit line 16, the bit line will be pulled up to a voltage of $V_{CC}-|V_{tp}|$ by the current-to-voltage converter. $V_{tp}$ is threshold voltage of the PMOS device, inside the current-to-voltage converter. It will take more than 10 ns for an erased cell to discharge the sensing bit line 16 below the voltage level of the reference cell bit line 12.

The equalization scheme of the present invention performs a read without over-shoot or under-shoot of the sensing bit line voltage. The sensing bit line voltage is settled before the word line is up and read. Once the word line is ready, the control signal will turn low and let the sensing work by itself.

One advantage of the design of the present invention is that it pre-sets the voltage level of sensing bit line between two possible target levels. This scheme relieves the worst-case condition.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A flash memory, including:
   at least one flash memory cell that draws an erased current when in an erased state and a programmed current when in a programmed state;
   a cell bit line coupled to the at least one flash memory cell;
   a reference bit line drawing a reference current selected to be about midway between the erased current and the programmed current of the at least one flash memory cell;
   a cell current-to-voltage converter coupled to the cell bit line;
   a reference current-to-voltage converter coupled to the reference bit line; and
   a cell bit line precharge circuit selectively coupling a reference output voltage from the reference current-to-voltage converter to the cell bit line during a bit line precharge period.

2. The flash memory of claim 1 wherein the cell bit line precharge circuit comprises:
   a buffer amplifier having an input coupled to the reference bit line and an output; and
   a full pass gate having an input coupled to the output of the buffer amplifier, and output coupled to the cell bit line, and a control input coupled to a precharge signal line.

3. The flash memory of claim 1 further including:
   a comparator having a first input coupled to the cell current-to-voltage converter, a second input coupled to the reference current-to-voltage converter, and an output; and
   a data latch coupled to the output of the comparator.

4. The flash memory of claims 3 further including a full pass gate having an input coupled to the output of the comparator, an output coupled to the data latch, and a control input coupled to a read strobe signal line.

* * * * *